United States Patent
Muto (10) Patent No.: US 10,012,699 B2
(45) Date of Patent: Jul. 3, 2018

(54) BATTERY MONITOR APPARATUS

(71) Applicant: Toyota Jidosha Kabushiki Kaisha, Toyota-shi, Aichi-ken (JP)

(72) Inventor: Jun Muto, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 182 days.

(21) Appl. No.: 15/015,610

(22) Filed: Feb. 4, 2016

(65) Prior Publication Data

US 2016/0233700 A1   Aug. 11, 2016

(30) Foreign Application Priority Data

Feb. 9, 2015 (JP) ................... 2015-023555

(51) Int. Cl.
| | |
|---|---|
| *G01N 27/42* | (2006.01) |
| *G01N 27/416* | (2006.01) |
| *G01R 31/36* | (2006.01) |
| *H02J 7/00* | (2006.01) |
| *B60L 3/00* | (2006.01) |
| *B60L 11/18* | (2006.01) |

(52) U.S. Cl.
CPC .......... *G01R 31/362* (2013.01); *B60L 3/0046* (2013.01); *B60L 11/1855* (2013.01); *B60L 11/1866* (2013.01); *G01R 31/3658* (2013.01); *H02J 7/0014* (2013.01); *H02J 7/0021* (2013.01); *B60L 2240/547* (2013.01); *Y02T 10/7005* (2013.01); *Y02T 10/7055* (2013.01); *Y02T 10/7061* (2013.01)

(58) Field of Classification Search
CPC .. H02J 7/0021; G01R 31/362; G01R 31/3658
USPC .................. 320/162–163; 324/429, 433–434
See application file for complete search history.

(56) References Cited

U.S. PATENT DOCUMENTS

2010/0271036 A1 * 10/2010 Kishimoto .......... B60L 11/1855
324/434
2014/0232413 A1 * 8/2014 Kitahara ............ G01R 31/3658
324/434

(Continued)

FOREIGN PATENT DOCUMENTS

JP   2010-257750 A   11/2010
JP   2013-162635 A   8/2013

(Continued)

*Primary Examiner* — David V Henze-Gongola
(74) *Attorney, Agent, or Firm* — Dinsmore & Shohl LLP (57) ABSTRACT

A battery monitor apparatus includes unit batteries connected in series; a battery pack including battery modules connected in series by conductive members, each battery module including two or more of the unit batteries; voltage detection ICs to detect voltages of the unit batteries and the conductive members in circuit intervals connected in series, by potential differences of the circuit intervals; and an electronic control unit to monitor states of the unit batteries. At least one voltage detection IC detects a voltage of at least one of the two unit batteries adjacent to a conductive member, and detects a voltage of the conductive member adjacent to the two unit batteries. The electronic control unit monitors the states, based on the voltages of the unit batteries, and one or more of the voltages of the conductive members detected by one of the voltage detection ICs.

2 Claims, 5 Drawing Sheets

(56) References Cited

U.S. PATENT DOCUMENTS

2015/0008931 A1  1/2015  Sugeno et al.
2015/0069974 A1* 3/2015  Okada ................ G01R 31/3658
                                                       320/134

FOREIGN PATENT DOCUMENTS

JP    2014-117068 A    6/2014
JP    2014-157075 A    8/2014

* cited by examiner

BATTERY MONITOR APPARATUS

CROSS-REFERENCE TO RELATED APPLICATIONS

The present application claims the benefit of priority of Japanese Priority Application No. 2015-023555, filed on Feb. 9, 2015, the entire contents of which are hereby incorporated by reference.

FIELD

The disclosures herein generally relate to a battery monitor apparatus to monitor states (voltages and the like) of respective unit batteries in a battery pack that has multiple battery modules connected by conductive members such as bus bars, and each battery module includes some of the unit batteries connected in series.

BACKGROUND

Conventionally, a power storage apparatus has been known that includes an integrated circuit (a battery monitor IC) to detect voltages of unit batteries connected in series in a battery pack, and to monitor states of the respective unit batteries based on the voltages of the unit batteries detected by the battery monitor IC (see, for example, Japanese Laid-open Patent Publication No. 2013-162635).

Figure 1A:
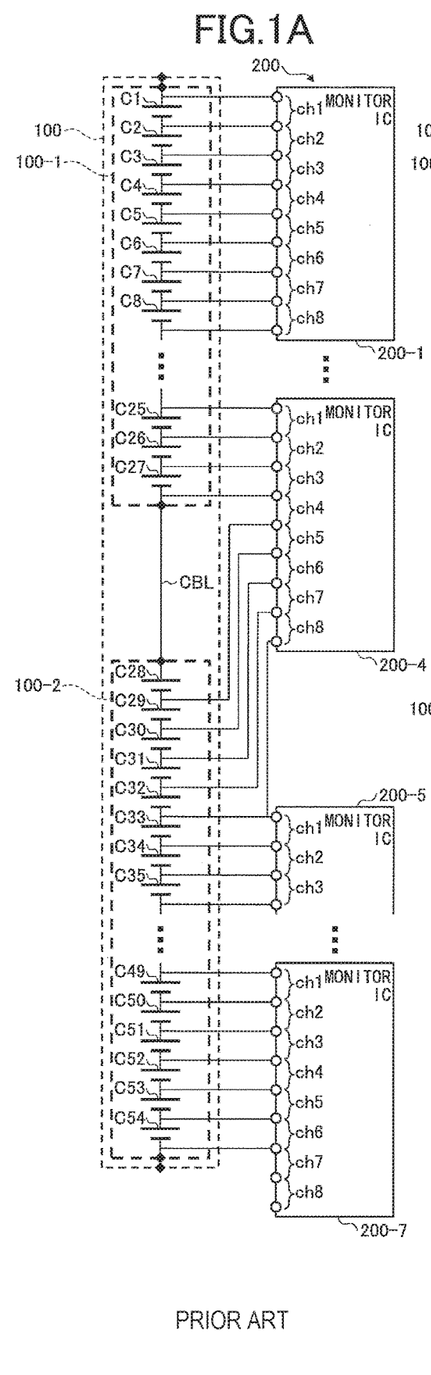
FIG. 1A is a diagram that illustrates an example of a configuration in which battery monitor ICs detect voltages of unit batteries included in a battery pack.
Figure 1B:
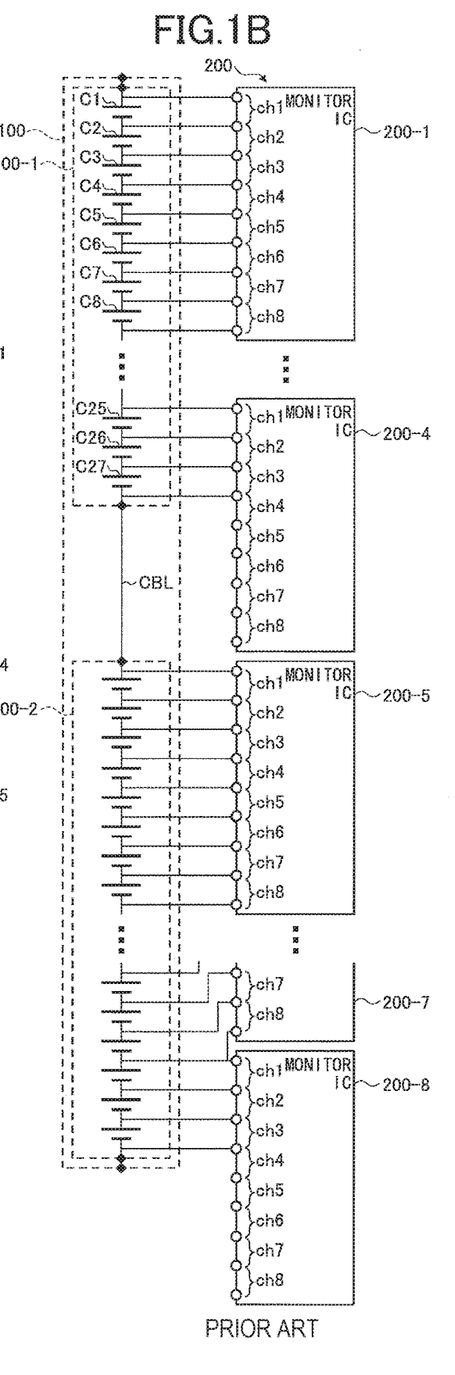
FIG. 1B is a diagram that illustrates an alternative example of a configuration in which battery monitor ICs detect voltages of unit batteries included in a battery pack.

FIGS. 1A-1B are diagrams that illustrate an example of a battery monitor apparatus that detects voltages of unit batteries included in a battery pack by using voltage detection ICs as in the conventional art (e.g., Japanese Laid-open Patent Publication No. 2013-162635). Specifically, the diagrams illustrate an example of a configuration to detect voltages of multiple unit batteries (battery cells C1 to C54) that are connected in series and included in a battery pack 100 constituted with multiple battery modules 100-1 and 100-2, by voltage detection ICs 200 (200-1 to 200-8).

Referring to FIG. 1A, each of the voltage detection ICs 200 detects voltages of eight battery cells that are connected in series, by voltage detection lines that are connected to nine ports (channels ch1 to ch8). That is to say, in each of the voltage detection IC 200, a voltage detection point (a voltage detection line), which corresponds to electrodes of two adjacent unit batteries connected with each other, is shared by two adjacent channels. This decreases the number of ports and the number of wires of a voltage detection IC, compared to a case where voltages are detected by connecting the respective electrodes of a unit battery with a voltage detection IC one by one. Therefore, the cost and the circuit size can be reduced.

On the other hand, when adopting such a configuration, if a battery pack is constituted with multiple battery modules connected by conductive members, voltages of some unit batteries (e.g., the voltage of the battery cell C28 in FIG. 1A) may be detected as voltages that include voltage drops caused by resistance of the conductive members. Specifically, if the number of unit batteries included in a battery module is not a multiple of the number of channels of the voltage detection IC, some voltage detection ICs may detect voltages of unit batteries over multiple battery modules. Therefore, at least one of detected voltages of unit batteries adjacent to a conductive member connecting two battery modules with each other, may include a voltage drop due to the resistance of the conductive member. Usually, since unit batteries in a battery module are placed closely together, their electrodes may be directly connected, or connected by connection members having very short length. Therefore, the resistance of such an "intra-module" connection member has little influence on the voltages of unit batteries, which are to be detected by the voltage detection IC. In contrast to this, a conductive member connecting battery modules with each other has a certain length due to a layout restriction and/or maintainability. Therefore, the resistance of such an "inter-module" conductive member has very large influence on the voltages of unit batteries, which are to be detected by the voltage detection IC. In this case, a voltage including a voltage drop due to the resistance of the conductive member connecting battery modules with each other is detected as the voltage of a unit battery, and hence, precision of the detected voltage of the unit battery may be reduced, and it may not be possible to monitor the state of the unit battery appropriately.

Therefore, as an example, as illustrated in FIG. 1B, the apparatus may be configured so that no voltage detection IC is provided that detects voltages of unit batteries over multiple battery modules. In this case, the influence of the resistance of an "inter-module" conductive member can be excluded, and a voltage detection IC can detect the voltage of a unit battery on the boundary of modules, with high precision.

However, if the apparatus is configured so that no voltage detection IC is provided that detects voltages of unit batteries over multiple battery modules, the number of voltage detection ICs needs to be increased as many as the number of "inter-module" conductive members. Especially, considering maintainability and the like, if a battery module is adopted that is constituted with a comparatively less number of unit batteries, the number of battery modules included in a battery pack may increase comparatively greater. In this case, the number of voltage detection ICs to be installed increases proportional to the number of battery modules. Therefore, the cost and circuit size may increase due to the increased number of voltage detection ICs to be installed.

In view of the above problem, it is an object of at least one embodiment to provide a battery monitor apparatus that can detect voltages of unit batteries in a battery pack having multiple battery modules connected in series where each battery module includes multiple unit batteries connected in series, and can monitor the unit batteries appropriately by the states of the respective unit batteries based on the detected voltages, without increasing the cost and circuit size of the apparatus.

SUMMARY

According to an embodiment, a battery monitor apparatus includes a plurality of unit batteries connected in series; a battery pack including a plurality of battery modules connected in series by conductive members, each of the battery modules being configured to include two or more of the unit batteries connected in series among the plurality of the unit batteries; a plurality of voltage detection ICs configured to detect voltages of circuit elements including the plurality of unit batteries and the conductive members in a plurality of circuit intervals connected in series, by potential differences between endpoints of the circuit intervals, and to detect voltages of two or more of the unit batteries connected in series among the plurality of the unit batteries; and an electronic control unit configured to monitor states of the unit batteries. At least one of the voltage detection ICs detects a voltage of at least one of the two unit batteries adjacent to one of the conductive members, and detects a voltage of the conductive member adjacent to the two unit batteries. The electronic control unit monitors the states, based on the voltages of the unit batteries detected by the voltage detection ICs, and the voltage of the conductive member detected by said at least one of the voltage detection ICs.

According to an embodiment, it is possible to provide a battery monitor apparatus that can detect voltages of unit batteries in a battery pack having multiple battery modules connected in series where each battery module includes multiple unit batteries connected in series, and can monitor the unit batteries appropriately by the states of the respective unit batteries based on the detected voltages, without increasing the cost and circuit size of the apparatus.

DESCRIPTION OF EMBODIMENTS

In the following, embodiments will be described with reference to the drawings.

Figure 2:
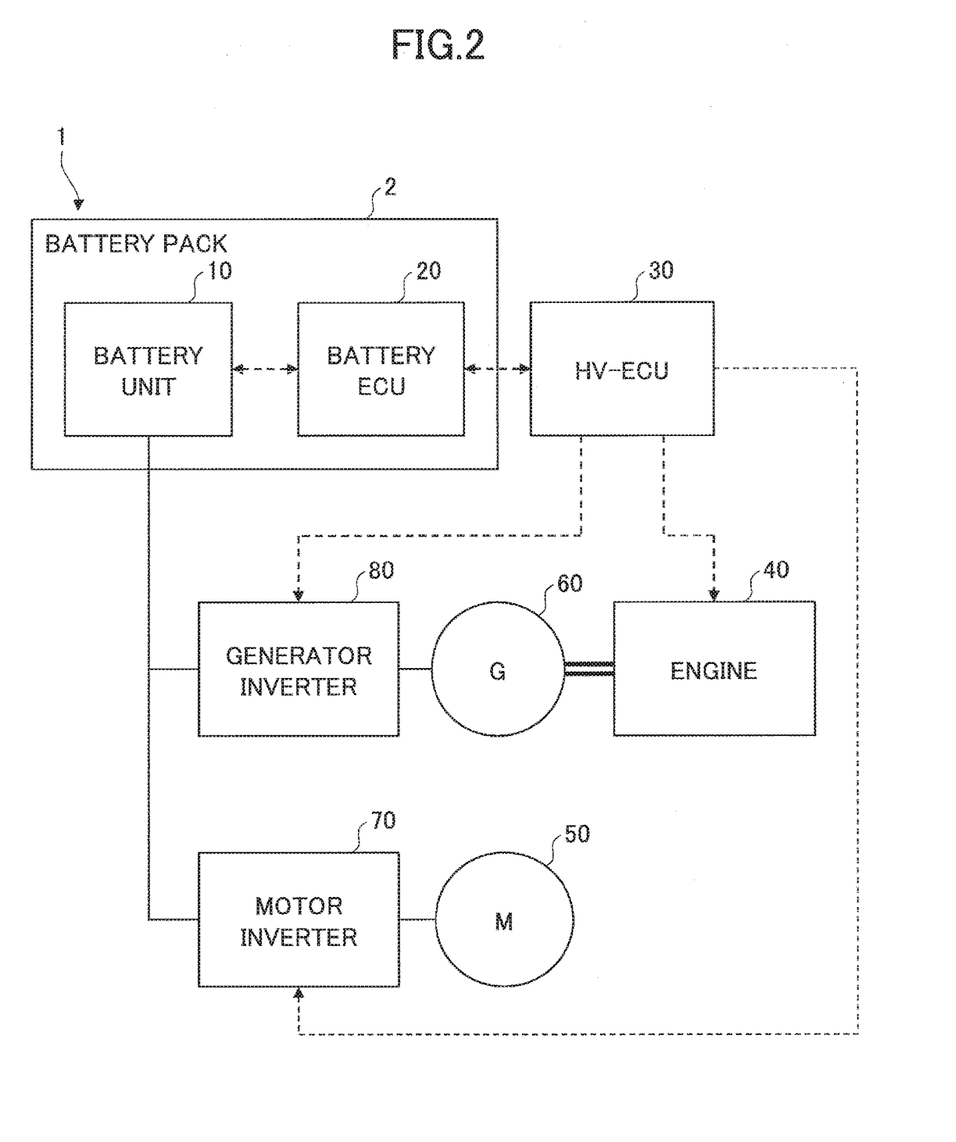
FIG. 2 is a block diagram that illustrates an example of a configuration of a vehicle including a battery monitor apparatus according to an embodiment.
Figure 3:
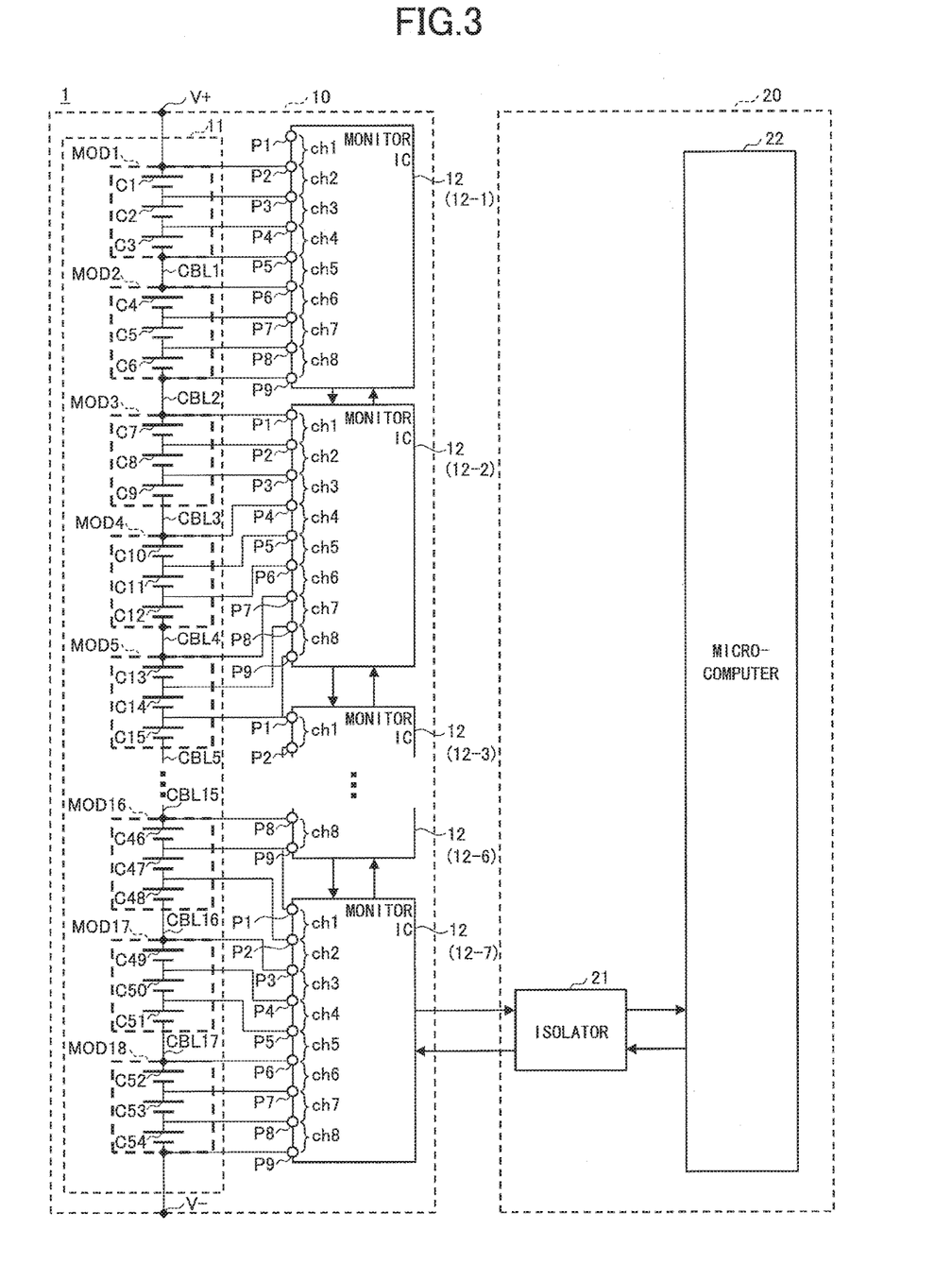
FIG. 3 is a block diagram that illustrates an example of a configuration of a battery monitor apparatus according to an embodiment.

FIG. 2 is a block diagram that illustrates an example of a configuration of a vehicle including a battery monitor apparatus 1 according to an embodiment. FIG. 3 is a block diagram that illustrates an example of a configuration of the battery monitor apparatus 1 according to the embodiment. Note that in FIG. 2, a solid line represents a power supply line, a dotted line represents a communication line, and a double line represents a motive power transfer line.

The battery monitor apparatus 1 is built in a vehicle (e.g., a series-parallel-type, hybrid vehicle), and monitors a state of a battery unit 10 including battery cells C1-C54, which are unit batteries, configured to be capable of supplying power to a motor 50, which is one of driving force sources of the vehicle.

Note that the battery unit 10 (battery cells C1-C54) is discharged when it supplies power (of three-phase alternating current (AC)) to the motor 50 via a motor inverter 70. Also, the battery unit 10 (battery cells C1-C54) is charged when the power generated by a generator 60 having an engine 40 as a motive power source, which is another of the driving force sources of the vehicle, is supplied to the battery unit 10 as direct current (DC) power via a generator inverter 80. Also, the battery unit 10 (battery cells C1-C54) is charged when regenerative power (of three-phase AC) by the motor 50 functioning as a power generator when the vehicle decelerates, is supplied to the battery unit 10 as DC power via the motor inverter 70.

The battery monitor apparatus 1 includes the battery unit 10 and a battery electronic control unit (ECU) 20. Also, the vehicle includes an HV-ECU 30 as an element relating to the battery monitor apparatus 1.

Note that in the following, the inside of the battery unit 10 outputting a high voltage may be referred to as a "high-voltage" system, and the inside of the battery ECU 20 (except for an interface part with the battery unit 10) driven by a low voltage may be referred to as a "low-voltage" system.

The battery unit 10 is configured to include a battery pack 11 and monitor integrated circuits (ICs) 12.

The battery pack 11 is configured to have multiple unit batteries (54 battery cells C1-C54 in the embodiment) connected in series. Specifically, the battery pack 11 is configured to have multiple battery modules (18 battery modules MOD1-MOD18 in the embodiment) connected in series by conductive members CBL1-CBL17 (for example, bus bars or connection wires) where each battery module has two or more unit batteries (three battery cells in the embodiment) connected in series among the battery cells C1-C54. By configuring a battery pack with a comparatively large number of battery modules in this way, even if a failure occurs with some battery modules, a minimum number of units (battery modules) need to be replaced, and hence, the maintenance cost can be reduced.

The battery cells C1-C54 are 54 unit batteries. Each of the battery cells C1-C54 may be a unit cell of, for example, a lithium ion battery.

Note that the battery cells C1-C54 may be any other elements as long as they are unit batteries that can be charged and discharged, for example, another type of secondary batteries (nickel-hydrogen batteries) or capacitors. Also, the number of battery cells (54 cells) included in the battery pack 11 and the number of battery modules (18 modules) are just examples, and the numbers may be determined discretionally.

Each of the battery modules MOD1-MOD18 is configured to have three battery cells among the battery cells C1-C54, that are serially connected and contained in a prescribed housing or the like. Specifically, the battery modules MOD1, MOD2, and MOD18 contain the battery cells C1-C3, the battery cells C4-C6, . . . , and the battery cells C52-C54, connected in series, respectively. The housing of each of the battery modules MOD1 to MOD18 has a positive-polarity terminal that corresponds to the positive electrode of a battery cell positioned at one end on the higher potential side (simply referred to as the "battery cell on the higher potential side" below, e.g., a battery cell C1 of the battery module MOD1), and a negative-polarity terminal that corresponds to the negative electrode of a battery cell positioned at the other end on the lower potential side (simply referred to as the "battery cell on the lower potential side" below, e.g., a battery cell C3 of the battery module MOD1). Starting from the higher potential side, two adjacent battery modules among the battery modules MOD1, MOD2, . . . , and MOD18 are connected with each other via the respective negative-polarity terminal and the positive-polarity terminal, by one of the conductive members CBL1-CBL17. Thus, the battery pack 11 is realized as a body of serially connected battery modules MOD1-MOD18 (a body of serially connected battery cells C1-C54).

An output voltage required for the vehicle (for example, about 200 V) can be taken out of the battery pack 11 between a positive-polarity terminal V+ extending out of the positive-polarity terminal of the battery module MOD1 (the positive electrode of the battery cell C1), and a negative-polarity terminal V− extending out of the negative-polarity terminal of the negative-polarity terminal of the battery module MOD18 (the negative electrode of the battery cell C54).

A monitor IC 12 is a voltage detection circuit that is implemented as an integrated circuit (voltage detection IC), and specifically, detects voltages of battery cells among the battery cells C1-C54. The monitor IC 12 has nine ports connected with respective voltage detection lines as input lines, and eight channels ch1 to ch8 where each channel has two adjacent ports among the ports P1 to P9, to detect a voltage. In other words, in the monitor IC 12, a port is shared by two adjacent channels to detect voltages. The channels form multiple (eight in the embodiment) intervals that are connected in series, and used for voltage detection in circuits (simply referred to as "circuit intervals" below). By a potential difference between endpoints of a circuit interval, it is possible to detect a voltage of a circuit element (a battery cell or a conductive member) in the circuit interval. In the following, the endpoints of the circuit intervals used for voltage detection may be referred to as "detection points".

The monitor IC 12 may include, for example, a multiplexer and an AD converter(s) that are connected with the ports P1 to P9. With a multiplexer and an AD converter, the monitor IC 12 may be configured to apply time-division multiplexing to voltages of the channels ch1 to ch8 (analog signals) by the multiplexer, and to convert the voltages into corresponding digital signals by the AD converter, to output the converted digital signals to the battery ECU 20 (or the microcomputer 22). Alternatively, the monitor IC 12 may be configured to include eight AD converters to convert voltages of the channels ch1 to ch8 (analog signals) into corresponding digital signals by the multiplexer, respectively, to output the converted digital signals to the battery ECU 20 (or the microcomputer 22). In the following, seven monitor ICs 12 included in the battery monitor apparatus 1 will be referred to as the "monitor ICs 12-1 to 12-7", to distinguish them by respective codes when necessary.

Note that the number of circuit intervals (or circuit elements such as battery cells included in the circuit intervals) in which voltages can be detected by a monitor IC 12, or the number of channels, is set to eight in the embodiment as an example, which may be set discretionally.

Each of the monitor ICs 12-1 to 12-7 has two or more battery cells allocated that are connected in series, as targets of voltage detection among the battery cells C1-C54. The monitor IC 12-1 has the battery cells C1 to C6 allocated, as targets of voltage detection. Also, the monitor ICs 12-2 to 12-7 have six battery cells allocated, respectively, among 48 battery cells C7 to C54, that are connected in series from the high potential side, as targets of voltage detection. To put it plainly, the monitor ICs 12-2, 12-3, 12-4, 12-5, 12-6, and 12-7 have the battery cells C7 to C14, C15 to C22, C23 to C30, C31 to C38, C39 to C46, and C47 to C54 allocated, respectively, as targets of voltage detection.

As described above, the monitor ICs 12-1 to 12-7 detect the voltages of the battery cells by potential differences between the endpoints of the circuit intervals that include the battery cells as targets of voltage detection, respectively. Specifically, the monitor ICs 12-1 to 12-7 can detect the voltages of the battery cells as targets of voltage detection, respectively, by having every two adjacent ports connected with two voltage detection lines that are connected with electrodes of the battery cells, or wires connected with the electrodes.

As described above, the monitor IC 12-1 detects the voltages of the battery cells C1 to C6 that correspond to the battery modules MOD1 and MOD2.

To detect the voltages of the battery cells C1 to C3 that are connected in series in the battery module MOD1, the monitor IC 12-1 uses a shared detection point that corresponds to electrodes of two adjacent battery cells, when detecting the voltages of the two adjacent battery cells. In other words, the monitor IC 12-1 uses a port shared by two channels for detecting voltages of two adjacent circuit intervals (or battery cells included in the circuit intervals). For example, a voltage detection line that is connected with a detection point corresponding to the electrodes connecting the battery cells C1 and C2 in the battery module MOD1, is connected with the port P3. Then, the monitor IC 12-1 detects the voltage of the battery cell C1 by the port P2 and the port P3 (constituting the channel ch2) where P2 corresponds to the detection point on the positive electrode side of the battery cell C1, and detects the voltage of the battery cell C2 by the port P3 and the port P4 (constituting the channel ch3) where P4 corresponds to the detection point on the negative electrode side of the battery cell C2. In this way, the monitor IC 12-1 detects the voltage of three battery cells C1 to C3 in the battery module MOD1 by four ports P2 to P5 (channels ch2 to ch4).

Similarly, for detecting the voltages of the battery cells C4 to C6 that are connected in series in the battery module MOD2, the monitor IC 12-1 uses a shared detection point that corresponds to electrodes of two adjacent battery cells, when detecting the voltages of the two adjacent battery cells. In other words, the monitor IC 12-1 uses a port shared by two channels for detecting voltages of two adjacent circuit intervals (or battery cells included in the circuit intervals). For example, a voltage detection line that is connected with a detection point corresponding to the electrodes connecting the battery cells C5 and C6 in the battery module MOD1, is connected with the port P8. Then, the monitor IC 12-1 detects the voltage of the battery cell C5 by the port P7 and the port P8 (constituting the channel ch7) where P7 corresponds to the detection point on the positive electrode side of the battery cell C5, and detects the voltage of the battery cell C6 by the port P8 and the port P9 (constituting the channel ch8) where P9 corresponds to the detection point on the negative electrode side of the battery cell C6. In this way, the monitor IC 12-1 detects the voltage of the three battery cells C4 to C6 in the battery module MOD1 by four ports P6 to P9 (channels ch6 to ch8).

Thus, by using shared detection points that correspond to electrodes of adjacent battery cells, the number of wires inside and outside of the monitor IC 12-1, and the number of ports for voltage detection can be reduced. Therefore, the circuit size of the monitor IC 12-1 can be smaller, and the cost can be less. In the following, use of shared detection points that correspond to electrodes of adjacent battery cells in the monitor ICs 12-2 to 12-7, aims at the same effects.

Also, in addition to the voltages of the battery cells C1 to C6, the monitor IC 12-1 detects the voltage of the conductive member CBL1 that connects the negative-polarity terminal of the battery module MOD1 with the positive-polarity terminal of the battery module MOD2, which corresponds to a voltage drop in the conductive member CBL1. Specifically, two detection points are separately disposed on the conductive member CBL1 (for example, on both ends): one detection point is on the negative electrode side of the battery cell C3 on the lower potential side of the battery module MOD1; and the other detection point is on the positive electrode side of the battery cell C4 on the higher potential side of the battery module MOD2. Thus, the monitor IC 12-1 can detect the voltage of the conductive member CBL1 that connects the battery modules MOD1 and MOD2 with each other, by the channel ch5 constituted with the port P5 that corresponds to the detection point on the negative electrode side of the battery cell C3, and the port P6 that corresponds to the detection point on the positive electrode side of the battery cell C4.

That is to say, the monitor IC 12-1 detects the voltages of the battery cells C3 and C4 adjacent to the conductive member CBL1, and also detects the voltage of the conductive member CBL1 that connects the battery cells C3 and C4 with each other.

In this way, by detecting potential differences between the endpoints of seven circuit intervals that are connected in series, the monitor IC 12-1 detects the voltages of seven circuit elements included in the circuit intervals (the battery cells C1, C2, and C3, the conductive member CBL1, and the battery cells C4, C5, and C6). Note that the monitor IC 12-1 detects the voltages of the battery cells C3 and C4 adjacent to the conductive member CBL1 by the potential difference between the endpoints of the circuit interval that does not include the conductive member CBL1.

Also note that the port P1 (or the channel ch1) of the monitor IC 12-1 is not used.

In the same way, each of the monitor ICs 12-2 to 12-7 detects the voltages of eight battery cells that are connected in series and allocated among the battery cells C7 to C54 from the higher potential side. The monitor ICs 12-2 to 12-7 detect the voltages of adjacent battery cells by using shared detection points on connection sides of adjacent battery cells which are targets of voltage detection. For example, a voltage detection line that is connected with a detection point corresponding to the electrodes on the connection sides of the battery cells C7 and C8, is connected with the port P2 of the monitor IC 12-2. Then, the monitor IC 12-2 detects the voltage of the battery cell C7 by the port P1 and the port P2 (constituting the channel ch1) where P1 corresponds to the detection points on the positive electrode side of the battery cell C7, and detects the voltage of the battery cell C8 by the port P2 and the port P3 (constituting the channel ch2) where P3 corresponds to the detection point on the negative electrode side of the battery cell C8. That is to say, each of the monitor ICs 12-2 to 12-7 detects the voltages of eight battery cells that are targets of voltage detection by nine ports P1 to P9 (channels ch1 to ch8).

More specifically, the monitor ICs 12-2 to 12-7 detect the voltages of eight battery cells over two or more battery modules. A detection point on the negative electrode side of a battery cell on the lower potential side of a battery module is disposed at one end on the lower potential side of a conductive member (the side closer to a lower battery module) that is connected with the negative-polarity terminal of the battery module. That is to say, the monitor ICs 12-2 to 12-7 detect the voltages of the battery cells on the lower potential sides of the battery modules MOD3 to MOD17 by potential differences between the endpoints (between the detection points) of circuit intervals including the conductive members CBL3 to CBL17. For example, the detection point on the negative electrode side of the battery cell C9 on the lower potential side of the battery module MOD3 is disposed at one end on the positive-polarity terminal side of the battery module MOD4 of the conductive member CBL3 that is connected with the negative-polarity terminal of the battery module MOD3. Then, the monitor IC 12-2 detects the voltage of the battery cell C9 by a potential difference between the endpoints (between the detection points) of the circuit interval corresponding to the conductive member CBL3, by using the ports P3 and P4 (constituting the channel ch3). That is to say, when detecting the voltages of two or more battery cells over adjacent battery modules, the monitor ICs 12-2 to 12-7 detect the voltage of a battery cell on the lower potential side of a battery module such that the detected voltage includes a voltage drop of a conductive member that connects the battery module with its adjacent lower battery module.

Note that although omitted in FIG. 3, between the ports of the battery cells C1-C54 (detection points on the positive-pole side and detection points on the negative-pole side), and the ports of the monitor ICs 12-1 to 12-7, additional elements may be disposed, such as filter circuits to remove noise, cell balancing circuits (equalizer circuits) to solve deviation of charged states (voltages) of the battery cells C1-C54, and fuses.

The battery ECU 20 is an electronic control unit to monitor a state of the battery unit 10 (battery cells C1-C54). The battery ECU 20 includes an isolator 21 and the microcomputer 22, and is connected with the HV-ECU 30 to enable communication between the devices via an in-vehicle LAN or the like.

Note that the battery ECU 20 (or the microcomputer 22) is connected with the monitor ICs 12-1 to 12-7 by a daisy-chain.

The isolator 21 is a known insulation interface that electrically insulates the battery unit 10 as a high-voltage system from the microcomputer 22 as a low-voltage system, through which the monitor IC 12 (12-7) in the battery unit 10 and the microcomputer 22 can communicate with each other.

The microcomputer 22 is a processor to execute various calculation processes, by running various programs stored in a ROM (Read Only Memory), on a CPU (Central Processing Unit).

The microcomputer 22 transmits a command to the monitor IC 12 (12-7), to have the monitor ICs 12-1 to 12-7 periodically detect voltages of the battery cells C1-C54 and the voltage of the conductive member CBL1, and to transmit detection signals corresponding to the detected voltages. As described above, the microcomputer 22 and the monitor ICs 12-1 to 12-7 are connected in the daisy chain. Therefore, the command transmitted from the microcomputer 22 is transferred through the monitor IC 12-7, the monitor IC 12-6, . . . , and the monitor IC 12-1, in this order. Then, in response to the command, the detection signals corresponding to the voltages of the battery cells C1-C54 detected by the monitor ICs 12-1 to 12-7, are transferred through the monitor IC 12-1, the monitor IC 12-2, . . . , and the monitor IC 12-7, in this order, and then, transmitted from the monitor IC 12-7 to the microcomputer 22. In the following, the communication periodically executed between the microcomputer 22 and the monitor ICs 12-1 to 12-7 may be referred to as the "periodic communication".

Also, the microcomputer 22 calculates the voltages of the battery cells C1-C54 and the voltage of the conductive member CBL1, based on the detection signals transmitted from the monitor ICs 12 (12-1 to 12-7). In the following, the voltages calculated by the microcomputer 22 based on the detection signals transmitted from the monitor ICs 12 (12-1 to 12-7), will be referred to as the "voltages detected by the monitor ICs 12 (12-1 to 12-7)".

Also, based on the voltages of the battery cells C1-C54 and the voltage of the conductive member CBL1 detected by the monitor ICs 12 (12-1 to 12-7), the microcomputer 22 monitors states (voltages, currents, states of charge (SOC), states of health (SOH) and the like) of the battery cells C1-C54. For example, the microcomputer 22 may monitor the SOCs by monitoring whether the voltages of the battery cells C1-C54 are within a prescribed range (between a prescribed upper limit and a prescribed lower limit). Then, if one of the battery cells C1-C54 has its voltage reach the upper limit or the lower limit, the microcomputer 22 may determine that it is overcharged or over-discharged, to control charging and discharging the battery cells C1-C54 via the HV-ECU 30 thereafter. Specifically, the microcomputer 22 transmits a signal indicating that one of the battery cells C1-C54 is overcharged (an overcharge signal), or a signal indicating that it is over-discharged (an over-discharge signal) to the HV-ECU 30. Also, the microcomputer 22 may determine that an overcurrent is flowing if the current flows in the battery cells C1 to C54 (or the battery pack 11) exceeds a prescribed threshold, to control charging and discharging the battery cells C1-C54 via the HV-ECU 30 thereafter. Specifically, the microcomputer 22 transmits a signal indicating that the overcurrent is flowing in the battery cells C1 to C54, to the HV-ECU 30. State monitoring of the battery cells C1 to C54 by the microcomputer 22 will be described later in detail.

Note that the microcomputer 22 may transmit information relating states of the battery cells C1-C54 other than the above signals (overcharge signal, over-discharge signal, and overcurrent signal), for example, a signal indicating a current state of charge (charge rate), and a signal indicating a current SOH.

The HV-ECU 30 is an electronic control unit to execute various control relating to the vehicle, including charge and discharge control of the battery unit 10 (battery cells C1-C54). The HV-ECU 30 may be constituted with, for example, a microcomputer, and may execute various control processes including charge and discharge control, by running various programs stored in a ROM, on a CPU.

The HV-ECU 30 may execute the charge and discharge control based on information transmitted from the battery ECU 20 (the microcomputer 22). For example, if receiving an overcharge signal from the microcomputer 22, the HV-ECU 30 may execute controlling so that charging is checked (inhibited) and discharging is accelerated on the battery cells C1-C54. Also, if receiving an over-discharge signal from the microcomputer 22, the HV-ECU 30 may execute controlling so that charging is accelerated and discharging is checked (inhibited) on the battery cells C1-C54. Also, if receiving an overcurrent signal from the microcomputer 22, the HV-ECU 30 may execute controlling so that charging and discharging are inhibited on the battery cells C1-C54.

The HV-ECU 30 is configured to be capable of controlling operations of the engine 40, the motor 50, and the generator 60. That is to say, depending on a traveling state of the vehicle and/or an operation by the driver, the HV-ECU 30 controls the engine 40, the motor 50, and the generator 60, to execute the charge and discharge control of the battery unit 10 (battery cells C1-C54).

Note that the HV-ECU 30 controls operations of the motor 50 and the generator 60 by controlling driving the motor inverter 70 and the generator inverter 80. Also, the HV-ECU 30 may execute controlling the engine 40, the motor 50 (or the motor inverter 70), and the generator 60 (or the generator inverter 80) via other ECUs that directly control the engine 40, the motor 50 (or the motor inverter 70), and the generator 60 (or the generator inverter 80).

Next, state monitoring of the battery cells C1 to C54 by the battery monitor apparatus 1 (or the battery ECU 20) will be described specifically.

As described above, when detecting the voltages of two or more battery cells over adjacent battery modules, the monitor ICs 12-2 to 12-7 detect the voltage of a battery cell on the lower potential side of a battery module such that the detected voltage includes a voltage drop of a conductive member that connects the battery module with its adjacent lower battery module. Therefore, imbalance may be generated between the voltage of a battery cell on the lower potential side of a battery module, and the voltages of battery cells other than the battery cell, which are detected by the monitor ICs 12-2 to 12-7. This will be described specifically using FIG. 4 below.

Figure 4:
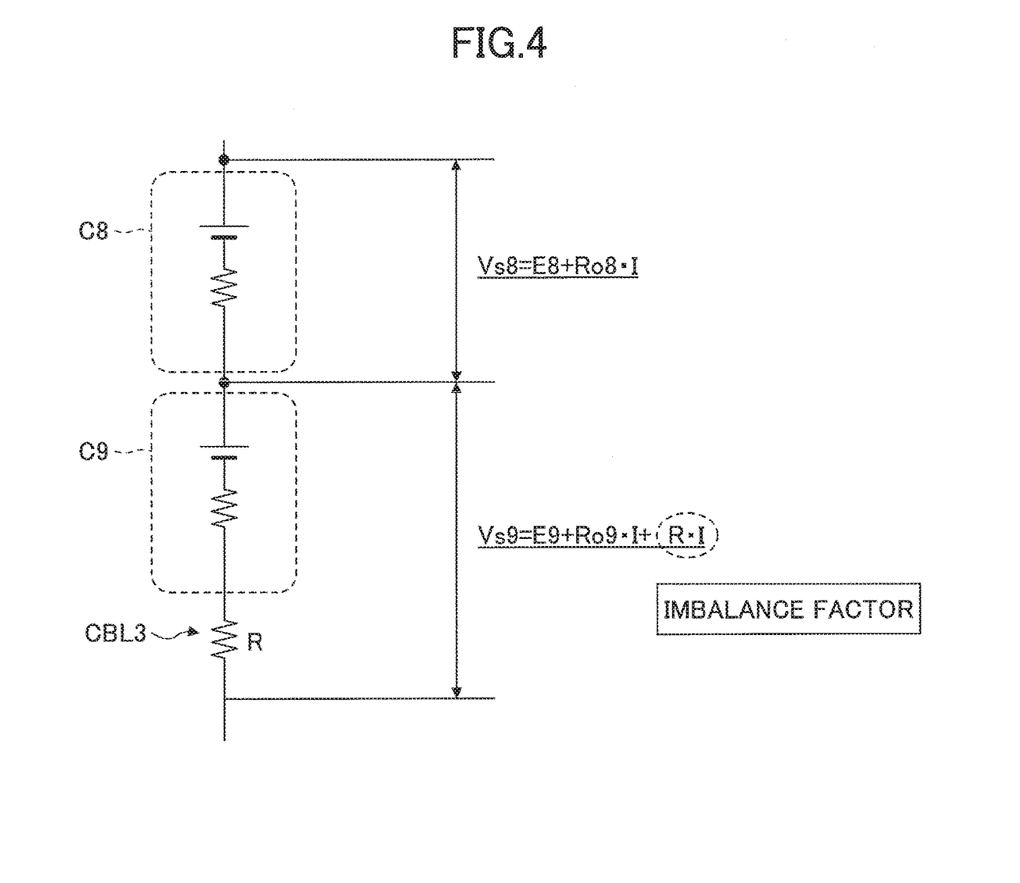
FIG. 4 is a diagram that compares the voltage of a battery cell positioned at an end on the lower potential side of a battery module, with the voltage of the other one of the battery cells, when the voltages are detected by a monitor IC.

FIG. 4 is a diagram that compares the voltage of a battery cell positioned at the end on the lower potential side of a battery module, with the voltage of the other one of the battery cells, which are detected by the monitor ICs 12-2 to 12-7. Specifically, the figure illustrates the voltages of the battery cells C8 and C9 in the battery module MOD3 detected by the monitor IC 12-2.

Here, Vs8 and Vs9 in the figure represent the voltages of the battery cells C8 and C9 detected by the monitor IC 12-2, respectively. Also, E8 and E9 represent electromotive forces of the battery cells C8 and C9, respectively. Also, Ro8 and Ro9 represent internal resistances of the battery cells C8 and C9, respectively. Also, I represents a current flowing in the battery cells C8 and C9 (or the battery pack 11) where the current is flowing in the positive direction when the battery cells C8 and C9 are being charged, and in the negative direction when the battery cells C8 and C9 are being discharged. Also, R represents the resistance of the conductive member CBL3.

Adjacent battery cells in the battery modules MOD3 to MOD18 may be directly connected with each other by their electrodes (the positive electrode and the negative electrode), or may be connected by a connection member between the electrodes very close to each other. Therefore, even with use of shared detection points that correspond to electrodes of adjacent battery cells as described above, the monitor ICs 12-2 to 12-7 can detect the voltages of battery cells, other than battery cells on the lower potential sides of the battery modules MOD3 to MOD18, with comparatively good precision. That is to say, the voltage Vs8 of the battery cell C8 detected by the monitor IC 12-2 can be represented by $Vs8=E8+Ro8 \cdot I$.

On the other hand, adjacent battery modules are connected via one of the conductive members CBL1 to CBL17. In general, the conductive members CBL1 to CBL17 have a certain length due to layout restriction in the vehicle and maintainability, and the resistance is greater than that of connection members for adjacent battery cells in the battery modules MOD1 to MOD18. Note that as described above, when detecting the voltages of two or more battery cells over adjacent battery modules, the monitor ICs 12-2 to 12-7 detect the voltage of a battery cell on the lower potential side of a battery module such that the detected voltage includes a voltage drop of a conductive member that connects the battery module with its adjacent lower battery module. Therefore, the voltage of the battery cell on the lower potential side of each of the battery modules MOD3 to MOD17 detected by the monitor ICs 12-2 to 12-7 is detected as a value that includes a voltage drop in the corresponding one of the conductive members CBL3 to CBL17. This implies that the voltage Vs9 of the battery cell C9 detected by the monitor IC 12-2 is represented by $Vs9=E9+Ro9 \cdot I + R \cdot I$.

Even if actual voltages of the battery cells C8 and C9 are virtually the same (E8≈E9, Ro8≈Ro9) as single elements, imbalance is generated between the voltages of the battery cells C8 and C9 when detected by the monitor IC 12-2, due to the amount of the voltage drop (R·I) in the conductive member CBL3.

In this way, since the detected voltage of the battery cell C9 includes the voltage drop in the conductive member CBL3, a detected value is higher than the actual voltage of the battery cell C9 when charging, or lower than the actual voltage of the battery cell C9 when discharging. In such a case, if the configuration described above is adopted that checks (inhibits) charging the battery cells C1 to C54 when the voltage of one of the battery cells C1 to C54 reaches the prescribed upper limit value, charging may be checked (inhibited) even when the actual voltage does not reach the upper limit value. Also, if the configuration described above is adopted that checks (inhibits) discharging the battery cells C1 to C54 when the voltage of one of the battery cells C1 to C54 reaches the prescribed lower limit value, discharging may be checked (inhibited) even when the actual voltage does not reach the lower limit value. This causes inconvenience that the voltage range (or the charged state) is narrowed to permit charging or discharging the battery cells C1 to C54. Especially, for a hybrid vehicle as in the embodiment, if the voltage range (or the charged state) is narrowed to permit charging or discharging, the operational frequency and operational load of the engine 40 are increased, and consequently, the fuel efficiency may get worse.

Thereupon, in addition to the voltages of the battery cells C1 to C54 detected by the monitor ICs 12 (12-1 to 12-7), the battery monitor apparatus 1 according to the embodiment detects the voltage of the conductive member CBL1 by the monitor IC 12-1, to monitor states of the battery cells C1 to C54. Specifically, based on the voltage of the conductive member CBL1, the battery monitor apparatus 1 calculates voltage drops by the conductive members included in the voltages of the battery cells detected by potential differences between the endpoints of the circuit intervals including the conductive members, among the voltages of the battery cells C7 to C54 detected by the monitor ICs 12-2 to 12-7. Then, the battery monitor apparatus 1 monitors states of the battery cells C1 to C54 considering the voltage drops.

As an example of a method of considering the voltage drops, there is a method that corrects the voltage of a battery cell detected by the potential difference between the endpoints of a circuit interval that includes a conductive member, among the voltages of the battery cells C7 to C54 detected by the monitor ICs 12-2 to 12-7. Also, as another example, there is a method that changes the monitor condition (the prescribed upper limit value and lower limit value to determine overcharging and over-discharging of the battery cells C1 to C54 described above) of battery cells whose voltages are detected by potential differences between the endpoints of circuit intervals that include respective conductive members, by voltage drops. In the following, a case will be described that adopts the former method that corrects the voltage of a battery cell detected by the potential difference between the endpoints of a circuit interval that includes a conductive member (the voltages of battery cells on the lower potential sides of the battery modules MOD3 to MOD17).

Figure 5:
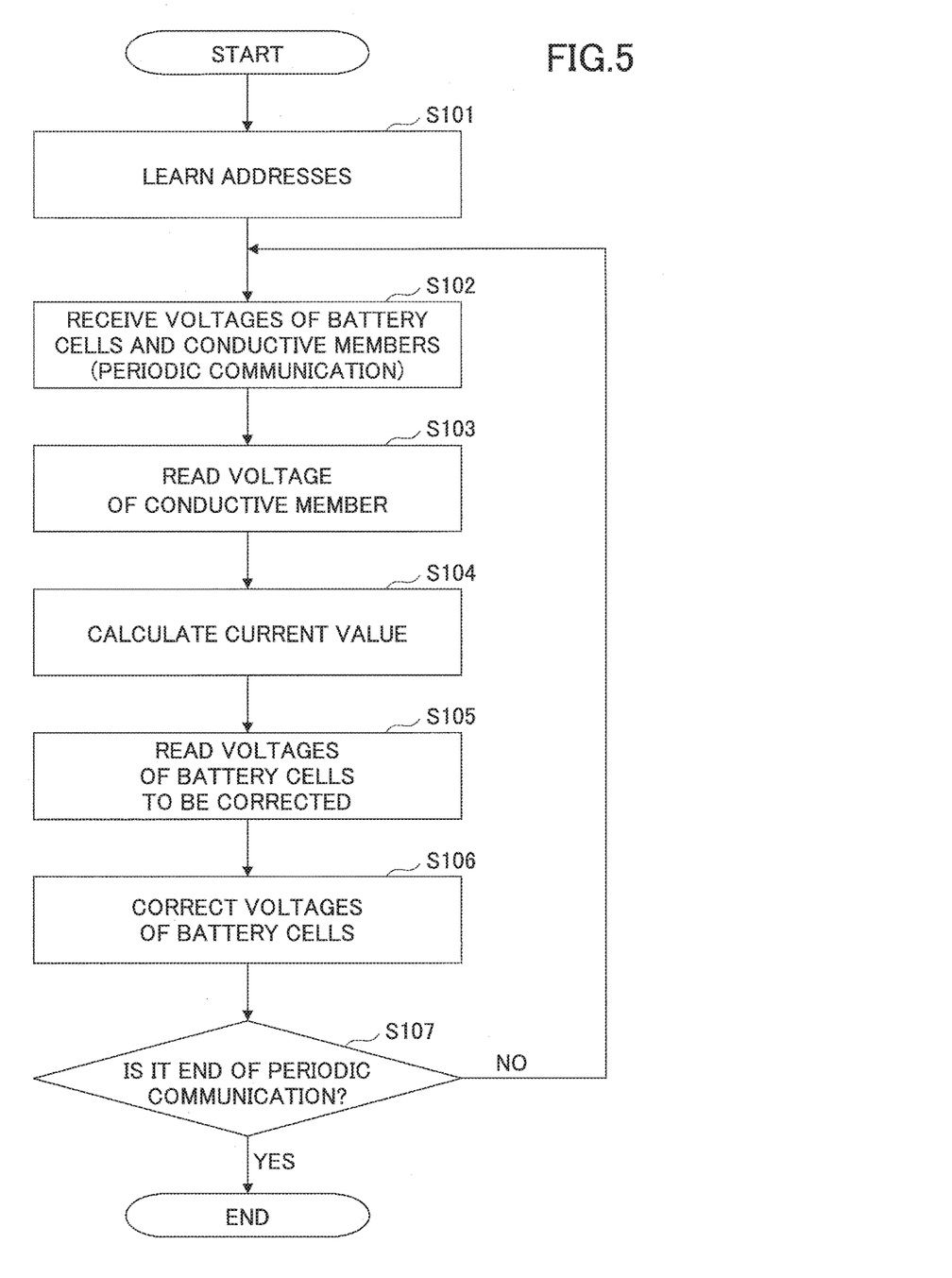
FIG. 5 is a flowchart that schematically illustrates an example of a voltage correction process by a battery monitor apparatus (or a battery ECU) according to an embodiment.

FIG. 5 is a flowchart that schematically illustrates an example of a voltage correction process executed by the battery monitor apparatus 1 (or the battery ECU) 20 according to the embodiment (a process to correct the voltage of a battery cell positioned at one end on the lower potential side of each of the battery modules MOD3 to MOD17, detected by the monitor ICs 12-2 to 12-7). Note that a process based on the flowchart is started when the ignition of the vehicle is turned on (IG-ON), or the microcomputer 22 of the battery ECU 20 is reset.

At Step S101, the microcomputer 22 executes a process to learn addresses of the monitor ICs 12-1 to 12-7 in the daisy-chain connection. Specifically, the microcomputer 22 transmits an address learning command to the monitor ICs 12-1 to 12-7. In response to receiving the address learning command, the monitor ICs 12-1 to 12-7 transmit signals that correspond to their own addresses to the microcomputer 22, respectively. Then, by receiving the signals, the microcomputer 22 learns the addresses of the monitor ICs 12-1 to 12-7.

At Step S102, the microcomputer 22 executes a periodic communication. Specifically, as described above, the microcomputer 22 transmits a command that requests transmission of detection signals that correspond to the voltages of the battery cells C1 to C54, and the voltage of the conductive member CBL1, and then, receives the detection signals transmitted from the monitor ICs 12-1 to 12-7 in response to the command.

At Step S103, the microcomputer 22 reads the voltage of the conductive member CBL1 (corresponding to the voltage drop in the conductive member CBL1) calculated based on the detection signal received at Step S102, from the internal memory or the like.

At Step S104, based on the voltage of the conductive member CBL1 read at Step S103, the microcomputer 22 calculates a current value (I in FIG. 4) that flows in the battery cells C1 to C54 (or the battery pack 11). For example, the microcomputer 22 may store a resistance value of the conductive member CBL1 that has been obtained in advance by an experiment, a simulation, or trimming work at factory shipment of the vehicle and the like, in the internal memory. Then, the microcomputer 22 may calculate the current value by dividing the voltage of the conductive member CBL1 detected by the monitor IC 12, by the stored resistance of the conductive member CBL1.

Note that the microcomputer 22 may calculate the current value considering other factors such as temperature. For example, the microcomputer 22 may determine (calculate) the resistance value considering temperature detected by a temperature sensor (not illustrated) or the like, based on a convert formula or a map (representing change of the resistance value by temperature) stored in advance in the internal memory, to calculate the current value from the resistance value.

At Step S105, the microcomputer 22 reads the voltage of a battery cell to be corrected among the voltages of the battery cells C1 to C54, calculated based on the detection signals received at Step S102. That is to say, the microcomputer 22 reads the voltages of battery cells detected by the potential differences between the endpoints of circuit intervals that include the conductive members (the voltages of battery cells on the lower potential sides of the battery modules MOD3 to MOD17).

At Step S106, using the current value calculated at Step S104, the microcomputer 22, corrects the voltages of the battery cells to be corrected that are detected by the monitor ICs 12-2 to 12-7. For example, the microcomputer 22 may store resistance values of the conductive members CBL3 to CBL17 that have been obtained in advance by an experiment, a simulation, or trimming work at factory shipment of the vehicle and the like, in the internal memory. Then, the microcomputer 22 may correct each of the voltages of the battery cells to be corrected by subtracting the product of the stored resistance value and the calculated current value, as the voltage drop of the corresponding one of the conductive members CBL3 to CBL17.

Note that if the resistance values of the conductive members CBL3 to CBL17 are virtually the same, the microcomputer 22 may correct the voltages of the battery cells to be corrected by subtracting, the voltage of the conductive member CBL1 read at Step S103 (corresponding to the voltage drop in the conductive member CBL1) directly from the voltages of the battery cells to be corrected. In this case, Step S104 may be omitted.

At Step S107, the microcomputer 22 determines whether to terminate the periodic communication, due to an ignition off (IG-OFF) of the vehicle or the like. If having determined not to terminate the periodic communication, the microcomputer 22 goes back to Step S102, and repeats Steps S102 to S107; or if having determined to terminate the periodic communication, the microcomputer 22 terminates the current process.

Note that if the resistance values of the conductive members CBL3 to CBL17 are virtually the same, the voltage correction process by the battery ECU 20 (or the microcomputer 22) may be executed in analog circuits in the monitor ICs 12-2 to 12-7. That is to say, a configuration is adopted in which a detection signal that corresponds to the voltage of the conductive member CBL1 detected by the monitor IC 12-1 can be transferred to the monitor ICs 12-2 to 12-7. Then, based on the detection signal that corresponds to the voltage of the conductive member CBL1, the analog circuits in the monitor ICs 12-2 to 12-7 may execute respective processes to cancel the voltage drops by the conductive members CBL3 to CBL17.

In this way, by using the monitor IC 12-1 among the monitor ICs 12-1 to 12-7, the battery monitor apparatus 1 according to the embodiment detects the voltage of the conductive member CBL1 that corresponds to the voltage drop in the conductive member CBL1 in addition to the voltages of the battery cells C1 to C6. Then, the battery monitor apparatus 1 monitors the states of the battery cells C1 to C54, based on the voltages of the battery cells C1 to C54 detected by the monitor ICs 12-1 to 12-7, and the voltage of the conductive member CBL1 that corresponds to the voltage drop in the conductive member CBL1. Specifically, based on the voltage of the conductive member CBL1, the battery monitor apparatus 1 monitors the states of the battery cells C1 to C54 by calculating the voltage drops of the conductive members included in the voltages of the battery cells detected by the potential differences between endpoints (between detection points) of circuit intervals that include the conductive members, and considering the voltage drops. Thus, as described above, even when the voltages of the battery cells C1 to C54 are detected with use of shared detection points that correspond to electrodes of adjacent battery cells, effects of the voltage drops in the conductive members connecting the battery modules (imbalanced voltages) can be excluded. Therefore, states of the battery cells included in the battery pack can be monitored appropriately, and the inconvenience described above, such as worsened fuel efficiency due to the effects of the voltage drop, can be avoided.

Also, in the embodiment, the effects of the voltage drops in the conductive members that connect the battery modules with each other, can be excluded, by having at least one channel among the channels for voltage detection of the monitor ICs 12-1 to 12-7 used for voltage detection of the conductive member. Therefore, to exclude the effects of the voltage drops in the conductive members that connect the battery modules with each other, it is not necessary to avoid a monitor IC that detects voltages of battery cells over multiple battery modules. Also, it is not necessary to change the number of channels of a monitor IC appropriately, to match a configuration of a battery pack, and not to detect voltages of battery cells over multiple battery modules. Therefore, it is possible to monitor battery cells appropriately without increasing the cost and the circuit size.

Also, since the current flowing in the battery pack 11 (or the battery cells C1 to C54) can be calculated by detecting the voltage of the conductive member CBL1 by the monitor IC 12-1, it is not necessary to provide a current sensor or the like to monitor the state of the current flowing in the battery pack 11. That is to say, the battery monitor apparatus 1 according to the embodiment can monitor the state of the current flowing in the battery cells C1 to C54 (and whether it is an overcurrent) based on the current flowing in the battery cells C1 to C54 calculated by using the voltage of the conductive member CBL1 detected by the monitor IC 12-1.

Note that in the embodiment, the voltage of a battery cell on the lower potential side of a higher potential battery module among adjacent battery modules is detected by the potential difference between the endpoints of a circuit interval that includes a conductive member connecting the adjacent battery modules with each other, but the configuration is not limited to that. That is to say, the voltage of a battery cell on the higher potential side of a lower battery module among adjacent battery modules may be detected by the potential difference between the endpoints of a circuit interval that includes a conductive member connecting the adjacent battery modules with each other. For example, the monitor IC 12-2 may detect the voltage of the higher potential battery cell C10 of battery module MOD4, instead of the voltage of the battery cell C9 on the lower potential side of the battery module MOD3, by the potential difference between the endpoints of the circuit interval that includes the conductive member CBL3.

Also, in the embodiment, the voltage of the conductive member CBL1 is detected by the monitor IC 12-1. Instead, one of the voltages of the conductive members CBL2 to 17 may be detected by the corresponding one of the monitor ICs 12-1 to 12-7. For example, the monitor IC 12-1 may detect the voltages of the battery cells C4 to C6 by the channels ch5 to ch7, and may detect the voltage of the conductive member CBL2 by the channel ch8. In this case, the monitor IC 12-1 detects at least one of the voltages of the battery cells C3 and C4 by the potential difference of the circuit interval that includes the conductive member CBL1, and at least one of the detected voltages of the battery cells C3 and C4 is corrected based on the detected voltage of the conductive member CBL2.

Also, in the embodiment, although the monitor IC 12 (12-1) that detects the voltage of the conductive member CBL1, detects both voltages of the battery cells C3 and C4 adjacent to the conductive member, the monitor IC 12 (12-1) may detect at least one of the voltages of the battery cells adjacent to the conductive member. For example, to detect the voltage of the conductive member CBL2, the monitor IC 12-1 may detect the voltage of the battery cell C6 at the channel ch7 by the potential difference between the endpoints of a circuit interval that does not include the conductive member CBL2, and may detect the voltage of the conductive member CBL2 at the channel ch8.

Modified Example

Next, a modified example of the above embodiment will be described.

In the embodiment described above, the voltage of one conductive member is detected. In the modified example, voltages of two or more conductive members are detected, and based on the voltages of two or more conductive members, the voltages of the battery cells detected by the potential differences between the endpoints of circuit intervals that include the conductive members are corrected. Thus, effects of aging degradation of conductive members can be avoided.

Specifically, a conductive member may have its resistance changed by aging degradation. Also, imbalance of loads among the conductive members that is caused depending on a decreased battery capacitance due to differences of use histories among battery cells may generate different degradation development among the conductive members, and may introduce variations among the resistance values of the conductive members. For example, the resistance value of the conductive member CBL1 may change due to the aging degradation, or even if the resistance value of the conductive member CBL1 has hardly changed, degradation development of the other conductive members (any of the conductive part members CBL2 to CBL17) may come earlier to change their resistance values.

Thereupon, by detecting the voltages of two or more conductive members, effects of the aging degradation of the conductive members can be avoided. For example, by taking an average (including the load average) of current values of a battery pack calculated from detected voltages of two or more conductive members, respectively, effects of change of the resistance of some conductive members by degradation can be checked, to maintain the precision of the calculated current value comparatively higher. Also, if the resistance values of conductive members without degradation are virtually the same, a degree of degradation development of the conductive members can be determined by detecting and comparing the voltages of two or more conductive members, and the voltage of a conductive member having comparatively less degradation may be adopted to correct the voltages of the battery cells to be corrected.

In this way, in the modified example, by detecting the voltages of two or more conductive members, it is possible to avoid effects of the aging degradation of the conductive members, and effects of differences of degradation development among the conductive members, to continue state monitoring of the battery cells appropriately.

The embodiments have been described in detail. Note that embodiments are not limited to the above specific embodiments, but various changes, substitutions, and alterations could be made.

Also, the battery monitor apparatus according to the embodiments described above may be used for monitoring states of unit batteries included in a battery pack that is built in an electric vehicle other than a series-parallel-type hybrid vehicle (a range extender vehicle, an electric vehicle having only a motor as a driving force source, or the like).

Also, the battery monitor apparatus according to the embodiments described above may be used for monitoring a state of a battery pack that is built in an apparatus other than a vehicle (for example, a battery pack for a stationary electric storage device).

The invention claimed is:

1. A battery monitor apparatus, comprising:
   a plurality of unit batteries connected in series;
   a battery pack including a plurality of battery modules connected in series by conductive members, each of the battery modules including two or more of the unit batteries connected in series among the plurality of the unit batteries;
   a plurality of voltage detection ICs configured to detect voltages of circuit elements including the plurality of unit batteries and the conductive members in a plurality of circuit intervals connected in series, by potential differences between endpoints of the circuit intervals, and to detect voltages of two or more of the unit batteries connected in series among the plurality of the unit batteries; and
   an electronic control unit configured to monitor states of the unit batteries;
   wherein a first one of the voltage detection ICs detects a voltage of at least one of the two unit batteries coupled to a first one of the conductive members, and detects the voltage drop of the first conductive member coupled to the two unit batteries,
   wherein the electronic control unit monitors the states, based on the voltages of the unit batteries detected by the voltage detection ICs, and the voltage drop of the first conductive member detected by the first one of the voltage detection ICs,
   wherein when detecting the voltages of two unit batteries coupled to one of the conductive members other than the first conductive member whose voltage is detected by the first one of the voltage detection ICs, each of the voltage detection ICs detects the voltage of at least one of the two unit batteries by the potential difference between the endpoints of the circuit interval including the one of the conductive members,
   wherein the electronic control unit is further configured to correct the voltages of the unit batteries detected by the potential differences between the endpoints of the circuit intervals including the conductive members among the voltages of the unit batteries detected by the voltage detection ICs, based on the voltage drop of the first conductive member detected by the first one of the voltage detection ICs,
   wherein the electronic control unit monitors the states, based on the corrected voltages.

2. The battery monitor apparatus as claimed in claim 1, wherein the electronic control unit monitors the states, based on a current flowing in the battery pack calculated from the voltages of the conductive members detected by the first one of the voltage detection ICs.

* * * * *

UNITED STATES PATENT AND TRADEMARK OFFICE
CERTIFICATE OF CORRECTION

PATENT NO. : 10,012,699 B2
APPLICATION NO. : 15/015610
DATED : July 3, 2018
INVENTOR(S) : Jun Muto It is certified that error appears in the above-identified patent and that said Letters Patent is hereby corrected as shown below:

In the Specification

In Column 04, Line 44, delete "MOD1, MOD2, and MOD18" and insert --MOD1, MOD2, . . . , and MOD18--, therefor.

Signed and Sealed this
Fourth Day of September, 2018

Andrei Iancu
*Director of the United States Patent and Trademark Office*